(12) United States Patent
Vivari, Jr.

(10) Patent No.: US 9,919,386 B2
(45) Date of Patent: *Mar. 20, 2018

(54) FLUX AND SOLDER MATERIAL AND METHOD OF MAKING SAME

(75) Inventor: John A. Vivari, Jr., Greenville, RI (US)

(73) Assignee: NORDSON CORPORATION, Westlake, OH (US)

( * ) Notice: Subject to any disclaimer, the term of this patent is extended or adjusted under 35 U.S.C. 154(b) by 575 days.

This patent is subject to a terminal disclaimer.

(21) Appl. No.: 13/207,214

(22) Filed: Aug. 10, 2011

(65) Prior Publication Data

US 2011/0311832 A1 Dec. 22, 2011

Related U.S. Application Data

(63) Continuation-in-part of application No. 13/015,167, filed on Jan. 27, 2011.
(Continued)

(51) Int. Cl.
*B32B 15/04* (2006.01)
*B23K 1/20* (2006.01)
(Continued)

(52) U.S. Cl.
CPC ........ *B23K 35/3613* (2013.01); *B23K 35/025* (2013.01); *B23K 35/0244* (2013.01); *B23K 35/36* (2013.01); *B23K 35/362* (2013.01); *B23K 35/368* (2013.01); *B23K 35/3618* (2013.01); *B23K 35/40* (2013.01); *B32B 15/01* (2013.01); *B32B 15/02* (2013.01); *B32B 15/04* (2013.01);
(Continued)

(58) Field of Classification Search
None
See application file for complete search history.

(56) References Cited

U.S. PATENT DOCUMENTS 2,323,118 A * 6/1943 Caplan ........................... 524/77
4,143,005 A 3/1979 Packer
(Continued)

FOREIGN PATENT DOCUMENTS

CN 102211261 A 10/2011
EP 0183705 A1 6/1986
(Continued)

OTHER PUBLICATIONS

European Patent Office, Search Report and Opinion in International Application No. 11153873.2, dated Jun. 20, 2011.
(Continued)

*Primary Examiner* — Vera Katz
(74) *Attorney, Agent, or Firm* — Baker & Hostetler LLP

(57) ABSTRACT

A flux for use in soldering comprises a first constituent and one or more secondary constituents that is selected from solvents, thickeners, and/or metal oxide reducing agents. The flux has a temperature profile in which the flux is in a non-flowable inactive state at temperatures at and below a maximum storage temperature that is above about 27° C., a liquid active state at an activation temperature, and a flowable inactive state in a deposition temperature range above the maximum storage temperature and below the activation temperature. A solder material comprises solder particles dispersed in the flux.

27 Claims, 2 Drawing Sheets

Related U.S. Application Data

Figure 1:
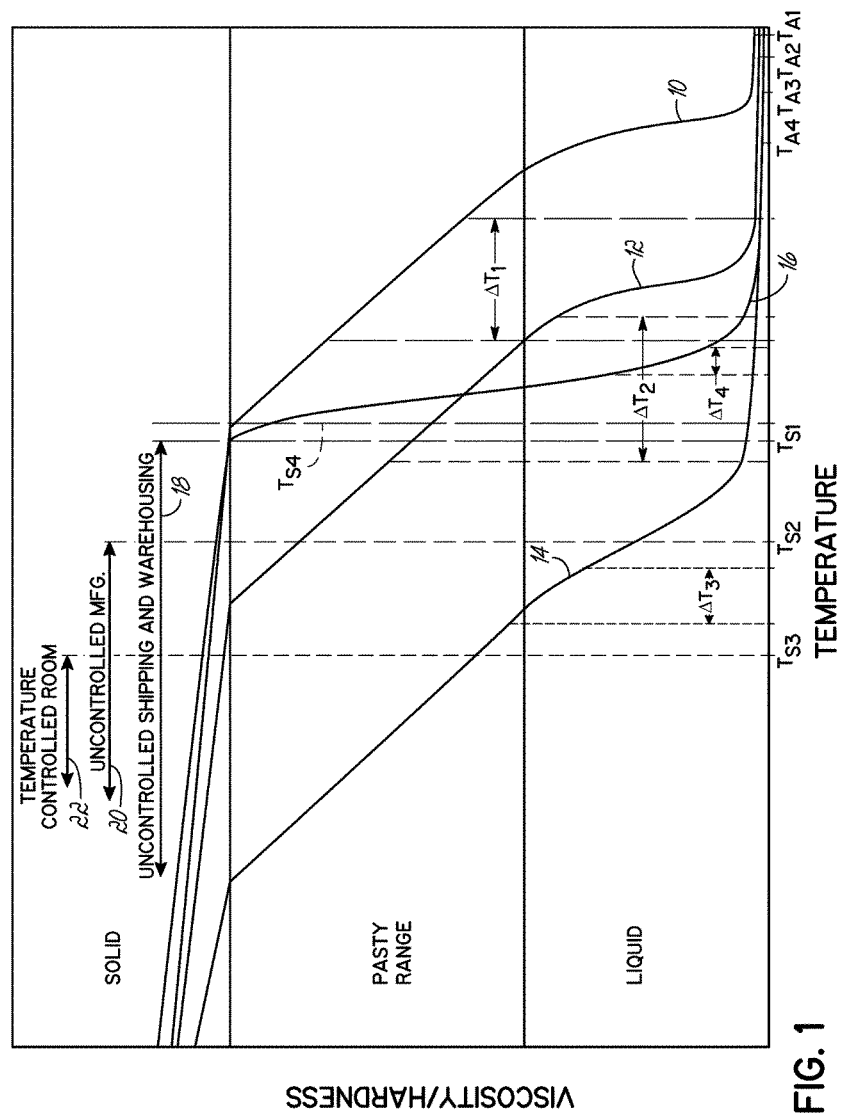

(60) Provisional application No. 61/302,721, filed on Feb. 9, 2010.

(51) Int. Cl.

| | | |
|---|---|---|
| *B23K 35/363* | (2006.01) | |
| *B23K 35/36* | (2006.01) | |
| *B23K 35/02* | (2006.01) | |
| *B23K 35/362* | (2006.01) | |
| *B23K 35/368* | (2006.01) | |
| *B23K 35/40* | (2006.01) | |
| *B32B 15/01* | (2006.01) | |
| *B32B 15/02* | (2006.01) | |
| *H05K 3/34* | (2006.01) | |

(52) U.S. Cl.
CPC .... *H05K 3/3489* (2013.01); *Y10T 428/12292* (2015.01); *Y10T 428/12493* (2015.01); *Y10T 428/2951* (2015.01); *Y10T 428/31678* (2015.04)

(56) References Cited

U.S. PATENT DOCUMENTS

| | | | |
|---|---|---|---|
| 4,194,931 A | | 3/1980 | Zado |
| 4,342,606 A | | 8/1982 | Notton |
| 4,429,457 A | * | 2/1984 | Noguchi et al. ............ 29/840 |
| 4,493,738 A | | 1/1985 | Collier et al. |
| 4,495,007 A | * | 1/1985 | Zado ............................ 148/23 |
| 4,523,712 A | | 6/1985 | Zado |
| 5,098,010 A | | 3/1992 | Carmichael et al. |
| 5,435,462 A | | 7/1995 | Fujii |
| 5,863,355 A | | 1/1999 | Ohno et al. |
| 6,592,020 B1 | * | 7/2003 | Currie et al. ............... 228/224 |
| 7,569,164 B2 | | 8/2009 | Sakurai et al. |
| 7,575,150 B2 | | 8/2009 | Saito et al. |
| 7,604,154 B2 | | 10/2009 | Matsumoto et al. |
| 2004/0026484 A1 | | 2/2004 | Yamashita et al. |
| 2005/0187212 A1 | * | 8/2005 | Ohki et al. ................. 514/226.5 |
| 2008/0073000 A1 | | 3/2008 | Ikeda et al. |
| 2010/0112250 A1 | * | 5/2010 | Shelby et al. ............... 428/35.7 |
| 2010/0112251 A1 | * | 5/2010 | Shelby et al. ............... 428/35.7 |
| 2011/0195267 A1 | * | 8/2011 | Vivari, Jr. ................... 428/586 |

FOREIGN PATENT DOCUMENTS

| | | |
|---|---|---|
| GB | 2380964 A | 4/2003 |
| JP | 1284495 | 11/1989 |
| JP | 2007044733 A | 2/2007 |
| JP | 2009078299 A | 4/2009 |
| JP | 2010196093 A | 9/2010 |
| JP | 2011005521 A | 1/2011 |
| WO | 8002663 A1 | 12/1980 |

OTHER PUBLICATIONS

Altera Corporation, Reflow Soldering Guidelines for Surface-Mount Devices, Application Note 81 (AN 81), Jun. 2002, ver. 4, pp. 1-10.
European Patent Office, extended Search Report in European Patent Application No. 12179468, dated Nov. 13, 2012.
Chinese Patent Office, Office Action in Chinese Patent Application No. 201110035989.6, dated Mar. 4, 2014.
European Patent Office, Office Action in EP 11143873.2 dated Mar. 10, 2014.
Chinese Patent Office, Office Action in Chinese Patent Application No. 201210285749.6, dated Jul. 17, 2015.
Japanese Patent Office, Office Action in JP2011-025004, dated Dec. 22, 2014.
Chinese Patent Office, Office Action in Chinese Patent Application No. 201110035989.6 dated Jan. 12, 2015.
JP H01-284495 (English translation), published by the Japanese Patent Office on Nov. 15, 1989.
Japanese Patent Application No. 2012-177823: Reasons for Refusal dated Apr. 26, 2016, 7 pages.
Japanese Patent Application No. 2012-177823: Decision of Refusal dated Mar. 9, 2017, 3 pages.

* cited by examiner

FLUX AND SOLDER MATERIAL AND METHOD OF MAKING SAME

CROSS-REFERENCE TO RELATED APPLICATION

This application is a continuation-in-part application of U.S. patent application Ser. No. 13/015,167 entitled "FLUX AND SOLDER MATERIAL AND METHOD OF MAKING SAME," filed on Jan. 27, 2011, which claims priority to U.S. Patent Application Ser. No. 61/302,721, filed on Feb. 9, 2010, the disclosure of each of which is incorporated by reference herein in its entirety.

FIELD OF THE INVENTION

This invention generally relates to solder fluxes and solder materials and, more particularly, to solder fluxes and solder materials having a predetermined temperature-viscosity relationship.

BACKGROUND OF THE INVENTION

During a soldering process, two or more parts are joined to one another with a solder. As is known in the art, and by definition, solder is an alloy or filler metal having a liquidus temperature not exceeding 450° C. (840° F.). While in contact with the parts to be joined, the solder is melted and flows into the joint by capillary action. Upon cooling the molten solder, a permanent joint is formed between the parts. One common application of solders is in the electronics industry where solders are used to join electrical components. Solder may be supplied by a multicomponent paste that is deposited on the surface of at least one of the parts to be joined. Typically, the paste contains a flux and particles of a solder alloy. The flux is formulated to improve the soldering operation. For instance, fluxes are often formulated to remove surface contamination, like surface oxidation, from metallic parts. In that way, the flux may also improve the flow and wetting of the solder alloy across the metallic surface. In a soldering operation, once the solder paste is dispensed onto the surface, the solder paste is heated to a temperature where the flux prepares the surface. Upon further heating, the solder particles melt and flow across the prepared surface and into the joint, and following cooling, the solder forms the permanent joint.

Even though current solder pastes facilitate forming consistent, quality solder joints, there are difficulties with their use due to the pastes being temperature sensitive, in the sense that the pastes degrade or deteriorate when exposed to temperatures at or above room temperature prior to soldering. Specifically, with regard to temperature sensitivity, if the solder paste is exposed for prolonged periods at temperatures even as high as room temperature, it may gradually lose its beneficial attributes. Moreover, exposing the solder paste to greater temperatures hastens its deterioration. Consequently, current pastes are viewed as having a limited shelf life at and above room temperatures.

One solution to extend the shelf life of current pastes is to refrigerate them up to and including the time that the solder is deposited onto the parts to be joined. Refrigeration arrests or reduces chemical reactions from taking place within the paste and prevents the solder from separating from the flux prior to depositing. Typical refrigeration temperatures include temperatures generated by commercially available refrigeration or air conditioning equipment, such temperatures being generally below 10° C. However, refrigeration has significant drawbacks. Most notably, there are high capital and operational costs associated with using refrigeration equipment. Furthermore, more often than not, the nature of the manufacturing environment precludes refrigeration as a means for preventing degradation of the solder paste due to the elevated temperatures inherent in these environments or due to other factors including, for example, floor space within the manufacturing plant. Thus, solder pastes are not used in these environments because their beneficial attributes are limited or destroyed prior to the time that these benefits may be fully realized and because of the lack of a cost effective solution to these problems.

Another problem that limits or renders difficult the use of current solder pastes is that the solder paste remains soft or pasty following deposition. For example, problems arise when the solder paste is pre-deposited on the part but the actual soldering operation is performed at a later time and/or at another manufacturing facility. In the interim period between the deposition and the soldering operations, if the part is stored and/or handled, foreign objects may contact, rub against, or become stuck in the soft solder paste. In addition to the problems encountered due to foreign material being stuck to the paste, the paste may stick to the foreign object and adhere to that surface. This type of contact depletes the original deposit of paste, and, in extreme situations, the original deposit may be significantly depleted or even completely removed from the targeted surface. Additionally, the paste may inadvertently transfer to surfaces where the paste or solder alloy is detrimental to the part. In any event, the pasty, flowable nature of the paste at around room temperature limits post-deposition operations and may add to the manufacturing costs. While refrigerating the solder paste may improve the shelf life of the solder paste, it may not result in the solder paste becoming non-pasty at these temperatures. In other words, a cold solder paste may have all of the above-mentioned inadvertent transfer issues. In addition to the cost considerations set forth above, refrigeration is not generally a solution to preserve the deposited solder pastes.

One solution that partially addresses transportation and handling problems includes immediate reflow of a dispensed paste with a subsequent application of flux to protect the reflowed solder alloy. During an initial reflow, the solder paste is fused at the predetermined, deposited locations. Following cleaning, the solder alloy is flattened by reheating the deposited, fused solder alloy and is then cooled. An outer coating of flux is applied to the flattened solder to prevent oxidation of the solder and promote later reflow of the solder. The flux-covered, reflowed solder alloy may then be transported or stored for later use. However, as noted, such a process requires that the part be heated at least one additional time which may be counterproductive since, in the case of electronic assemblies, the parts themselves may be temperature sensitive. The additional heating cycle may increase the number of component failures. Furthermore, the flux remains tacky such that a release sheet is attached to the flux to prevent contamination.

Consequently, there is a need for a solder flux and solder material that addresses the aforementioned problems. For example, what is needed is a flux and/or a solder material that is non-pasty at or near room temperature and at temperatures above these temperatures including normal manufacturing, storage, and shipping temperatures. Furthermore, what is needed is a solder flux and solder material that may be heated prior to deposition, that does not degrade at the deposition temperature, and that may be cooled and reheated without degrading.

SUMMARY OF THE INVENTION

To these ends, in one embodiment of the invention, a flux for use in soldering comprises a first constituent and one or more secondary constituents that is selected from solvents, thickeners, and/or metal oxide reducing agents. The flux has a temperature profile in which the flux is in a non-flowable inactive state at temperatures at and below a maximum storage temperature that is above about 27° C., a liquid active state at an activation temperature, and a flowable inactive state in a deposition temperature range above the maximum storage temperature and below the activation temperature. In one embodiment, a solder material comprises solder particles that are dispersed in the flux. The solder particles are in a liquid state at or above the activation temperature.

In another embodiment, a method of making a solder material comprises heating the flux to a temperature within or above the deposition temperature range and below the activation temperature. The method further comprises dispersing solder particles throughout the heated flux to form a solder/flux mixture and cooling the solder/flux mixture to a temperature at or below the maximum storage temperature whereby the solder/flux mixture is in the non-flowable inactive state.

In another embodiment of the invention, a method of dispensing the solder material comprises heating the solder material to a temperature within or above the deposition temperature range and below the activation temperature. While the solder material is within or above the deposition temperature range and below the activation temperature, the method further comprises dispensing the heated solder material onto a substrate and cooling the solder material to a temperature at or below the maximum storage temperature whereby the solder material is in the non-flowable inactive state.

In another embodiment, a method of soldering with the solder material comprises heating the solder material to a temperature within or above the deposition temperature range and below the activation temperature. While the solder material is within or above the deposition temperature range and below the activation temperature, the method further comprises dispensing the heated solder material onto a work piece. The method further comprises heating the solder material to or above the activation temperature whereby the flux removes oxides from the surface of the work piece; heating the solder material to a melting temperature of the solder particles to melt the solder particles while in contact with the surface of the work piece; and cooling the melted solder.

In another embodiment, a method of soldering with the solder material comprises heating the solder material from a temperature at or below the maximum storage temperature to a melting temperature of the solder particles to melt the solder particles. The solder material is positioned between and in contact with each of a first work piece and a second work piece. The method further comprises cooling the melted solder whereby a joint is formed between the first and the second work pieces.

BRIEF DESCRIPTION THE DRAWING

The accompanying drawings, which are incorporated in and constitute part of this specification, illustrate embodiments of the invention and together with the detailed description given below, serve to explain various aspects of the invention.

Figure 2:
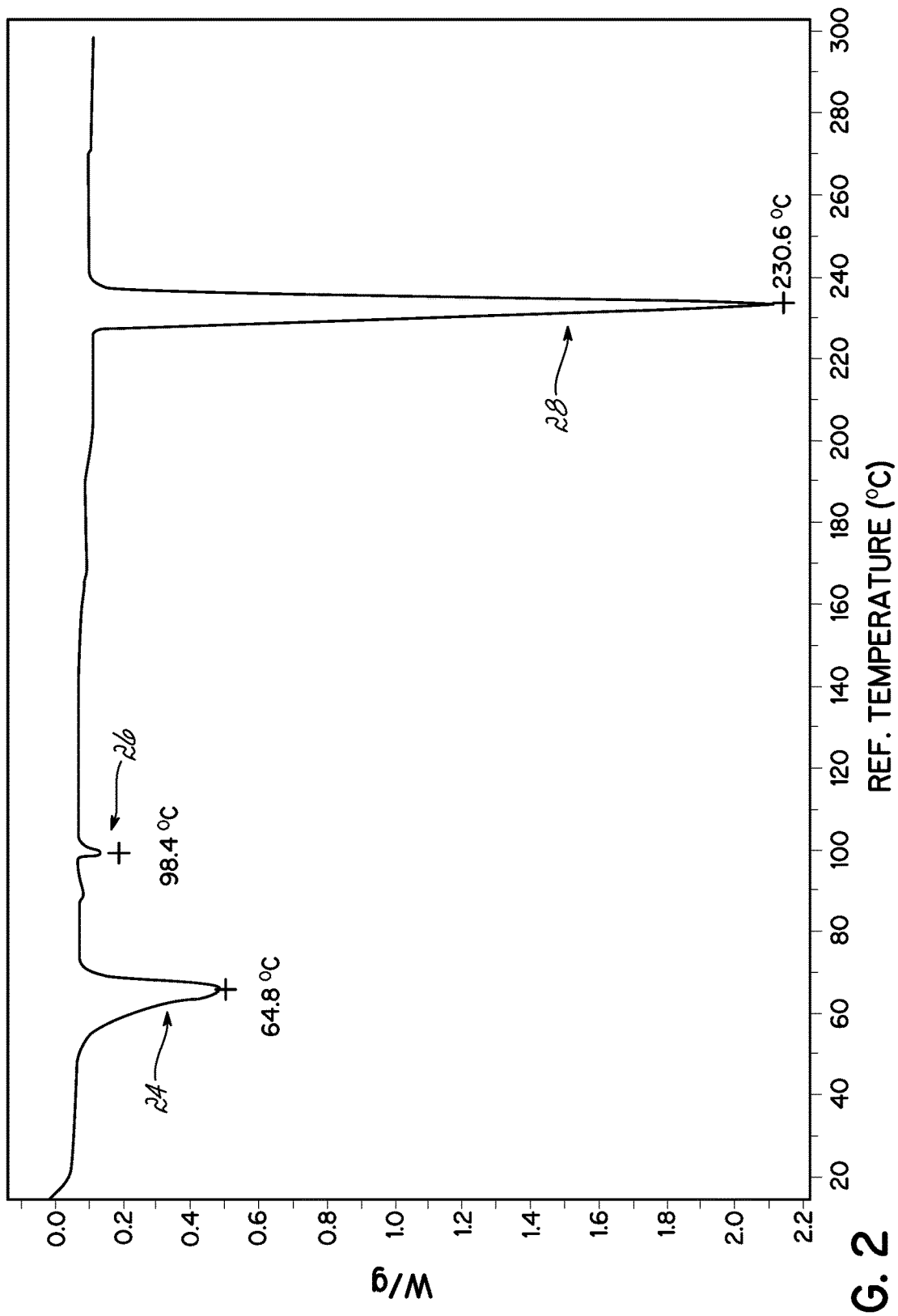

FIG. 1 is a temperature-viscosity/hardness graph depicting four temperature profiles for four exemplary embodiments of the invention; and FIG. 2 is an exemplary Differential Scanning calorimetry (DSC) plot of an exemplary flux according to one embodiment of the invention.

DETAILED DESCRIPTION

The present invention provides a solder flux for use in a soldering process. In one embodiment, the flux is mixed with particles of a solder alloy to form a soldering material. As set forth in more detail below, the flux comprises a first constituent and one or more secondary constituents that may be selected from solvents, thickeners, and/or metal oxide reducing agents or combinations thereof. While the relative amounts of the first constituent and the secondary constituents may vary depending on the desired temperature-viscosity relationship, as set forth below, in one embodiment, the first constituent is present in an amount greater than any single one of the secondary constituents. As such, the first constituent may form only a minority portion by weight of the flux. It will be appreciated, however, that embodiments of the present invention are not so limited. In this regard and in one embodiment, the first constituent may be present in an amount greater than about 50 wt % of the flux.

In accordance with one embodiment of the present invention, the first constituent, the secondary constituents, and/or the solder particles are selected to establish a specific temperature-viscosity/hardness relationship or profile that describes the viscosity of the flux over a range of temperatures. Specifically, the first and secondary constituents may be selected to establish a temperature profile to predetermine the viscosity of the flux at a maximum storage temperature, the viscosity of the flux at a temperature in a deposition temperature range, and the temperature at which the flux is active, each of which is more fully described below.

In particular, as shown in FIG. 1, in embodiments of the present invention, the flux is characterized by a temperature profile that describes a relationship between the temperature of the flux and the viscosity/hardness of the flux (i.e., the x-axis and y-axis, respectively). It will be appreciated that the temperature-viscosity/hardness relationship applies to the flux whether alone or mixed with the solder alloy (i.e., the solder material). Therefore, unless specifically noted herein, reference to the properties of the flux includes reference to either the flux or the solder material (i.e., the flux plus the solder alloy).

FIG. 1 depicts four different exemplary temperature profiles (labeled 10, 12, 14, and 16) each of which describes the viscosity-temperature relationship for an exemplary flux. In general, and with reference to the exemplary temperature profiles 10, 12, 14, and 16, the viscosity/hardness of each of the fluxes decreases with increasing temperatures. The viscosity/hardness of the flux is an indication of the flowability of the flux, with the flowability of the flux increasing with decreasing viscosity. Therefore, the temperature profile provides information regarding the flowability of the flux, by virtue of the viscosity/hardness, at temperatures encountered by the flux up to an activation temperature. By way of example and to more fully explain the relationship of the viscosity/hardness of the flux with the temperature of the flux, each of the exemplary temperature profiles 10, 12, 14, and 16, is partially described by a maximum storage temperature $T_{S1}$, $T_{S2}$, $T_{S3}$, and $T_{S4}$; a deposition temperature range $\Delta T_1$, $\Delta T_2$, $\Delta T_3$, and $\Delta T_4$; and an activation temperature $T_{A1}$, $T_{A2}$, $T_{A3}$, and $T_{A4}$, at or above which the flux is active and below which the flux is inactive, respectively.

The maximum storage temperature, e.g. $T_{S1}$, $T_{S2}$, $T_{S3}$, and $T_{S4}$, represents the highest temperature that the respective flux may tolerate and remain in a non-flowable state. As shown, the viscosity of each of the fluxes up to and including the maximum storage temperature $T_{S1}$, $T_{S2}$, $T_{S3}$, and $T_{S4}$ of the respective flux is relatively high. At these viscosities, the flux is non-flowable. That is, the flux is not conducive to being dispensed, pumped, or applied to a surface while the temperature of the flux is at a temperature at or below the maximum storage temperature. In addition, the flux may not be sticky or tacky. However, the composition of the flux may be adjusted, as set forth in more detail below, such that the flux has a predetermined tackiness in the non-flowable state. It will be appreciated that the predetermined tackiness may depend on the application for which the flux is designed to be used.

While the flux may be non-flowable when exposed to temperatures that are at or below the maximum storage temperature, heating the flux to temperatures above the maximum storage temperature reduces the viscosity/hardness of the flux. In other words, the flux becomes softer and more flowable at temperatures above the maximum storage temperature. Upon further heating, the temperature of the flux reaches the lower temperature of the deposition temperature range. From the lower end to the higher end of the deposition temperature range, the flux is flowable and is inactive. In other words, when the flux temperature is in the deposition temperature range, the viscosity of the flux is low enough to allow the flux to be dispensed. Dispensing the flux while the flux is in the flowable state may include, for example, forcing the heated flux through an orifice that may be heated. In one embodiment, the flux is dispensable with commercially available dispensing equipment, for example, DEK International stenciling equipment.

As shown, the deposition temperature range may vary according to the particular flux formulation. Furthermore, the deposition temperature range may include temperatures that are above the maximum storage temperature and that are below the activation temperature of the flux. By way of example only, the lower end of the deposition temperature range may be only a few degrees (e.g., about two or three degrees) hotter than the maximum storage temperature. However, embodiments of the invention are not so limited as the lower end of the deposition temperature range may be significantly hotter than the maximum storage temperature. In this regard, the temperature difference between the maximum storage temperature and the lower end of the deposition temperature range may be determined at least in part by the shape of the temperature profile, as is described in more detail below. By way of example, the deposition temperature range may include temperatures in the range of about 45° C. to about 100° C.

Further heating of the flux toward the higher end of the deposition temperature range may further reduce the viscosity of the flux. The viscosity of the flux may be reduced to a point where the flux flows under the influence of gravity, and upon further heating, the viscosity may decrease to the point where the flux is in a liquid state. The difference in temperature from the lower end to the upper end of the deposition temperature may be relatively large, such as, between about ten to about twenty degrees or more. The range may be predetermined by the slope of the viscosity-temperature profile and thus other temperature ranges may be observed. For example, where the slope of the temperature profile is steep, the deposition temperature range may be narrow and may in this instance be less than about 10° C. or less than about 5° C. On the other hand, where the slope is more gradual or shallow, the deposition temperature range may be more than about 10° C., though it may be less than about 100° C.

In one embodiment, the highest temperature in the deposition temperature range may be slightly (i.e., about two or three degrees) less than the activation temperature of the flux. However, it will be appreciated that there may be a range of temperatures between the highest deposition temperature and the activation temperature where the flux is too liquid to deposit and yet is not active. For example, where the solder particles are mixed with the flux (i.e., the solder material), the viscosity of the flux may decrease to a point where the particles settle or separate from the flux. Consequently, while the flux may be flowable and inactive at these temperatures, dispensing the solder material may be impractical where the solder particles cannot remain suspended in the flux. Thus, a practical upper limit to the deposition temperature range may be a temperature where the viscosity of the flux is reduced to a point where solder particles separate from the flux at a rate which negatively affects the quality of the solder paste deposit formed therefrom. However, one of ordinary skill will observe that the settling rate of the solder particles from the liquid flux may be influenced by the individual size of each solder particle as well as the density of the solder particles. In addition, the constituents of the flux, as set forth below, may be altered to promote and maintain the solder particles in suspension. Therefore, the practical upper limit temperature of the deposition temperature range of the solder material may be affected by changes in the solder particles and by changes to the constituents of the flux. Furthermore, the practical upper limit may also be dependent upon the equipment or device that is used to dispense the flux. In this regard, it will be appreciated that differences in equipment design may allow the flux to be successfully dispensed in one type of equipment, even though the viscosity of the flux is relatively low, whereas the flux at the same temperature may not be successfully dispensed in a different type of equipment.

At temperatures above the deposition temperature range, the viscosity of the flux may continue to decrease. In particular, with further heating, the viscosity of the flux may be low enough to be considered a liquid. As shown, the flux may transition from having a pasty-like viscosity to having more of a liquid-like viscosity. In addition, in this temperature range, the viscosity may decrease at an increasing rate with further increases in the temperature. As the temperature of the flux is further increased, the viscosity may decrease though at a decreasing rate until the viscosity reaches a nearly constant value with increasing temperature, as shown in FIG. 1.

With reference to temperature profiles 10, 12, 14, and 16 in FIG. 1, when the temperature of the respective flux reaches the respective activation temperature $T_{A1}$, $T_{A2}$, $T_{A3}$, and $T_{A4}$, the viscosity of the flux may be relatively low such that the flux may be considered to be in a liquid state. Therefore, at the activation temperature, e.g. $T_{A1}$, $T_{A2}$, $T_{A3}$, and $T_{A4}$, the flux may readily flow across the deposition surface.

In addition, when the flux reaches the activation temperature, the flux becomes active. In the active state, the flux may be reactive with the surface on which it is dispensed and/or the constituents of the flux may react with one another. By contrast, below the activation temperatures $T_{A1}$, $T_{A2}$, $T_{A3}$, and $T_{A4}$, the respective fluxes are in the inactive state. Thus, the flux may not react with the surface on which it resides nor do the flux constituents react with one another. Therefore, taking into account the liquid active state of the flux, upon reaching the activation temperature, the flux may flow across the surface while chemically reacting with any contaminates, like oxides, to prepare the surface for soldering. By way of example, the activation temperature may be at least about 50° C. In one embodiment, the activation temperature is above about 120° C.

At a temperature higher than the activation temperature, the viscosity of the flux may further decrease and any particles of solder may melt. However, as shown in FIG. 1, the viscosity of the flux may only slightly decrease or may not decrease at all at temperatures above the activation temperature. In this case, the viscosity of the flux may become constant, or nearly so, as the temperature of the flux approaches and then exceeds the activation temperature. Furthermore, for some fluxes, the viscosity of the flux may reach a minimum value at temperatures below the activation temperature. It will be appreciated that the minimum viscosity of any particular flux may be different from the minimum viscosity observed for a different flux. In one embodiment, the temperature-viscosity curve of the flux may become asymptotic with the temperature axis in a temperature range that includes the activation temperature.

At a temperature above the activation temperature, the solder particles may melt. Once the solder particles melt, the flux may additionally promote wetting between the molten solder and the surfaces of the parts to promote the formation of a quality solder joint. The flux may also limit the reaction of the molten solder with the ambient environment. The temperature required to melt the solder particles (not labeled in FIG. 1) depends on the solder and is at least as high as the activation temperature, though the melting temperature of the solder is usually higher than the activation temperature. For example, the melting temperature may be in excess of about 150° C. and is typically in the range of about 185° C. to about 280° C. As previously mentioned, the liquidus temperature (i.e. the lowest temperature at which the solder alloy is completely liquid) must be at or below 450° C. to qualify as a solder material. Following melting of the solder and upon cooling, the solder forms a permanent solder joint. During soldering, the flux may be partially or fully consumed, due to, for example, reactions with the surface. The residue from these reactions, if any, may then be removed in a subsequent cleaning operation.

In particular and with reference to temperature profile 10 in FIG. 1, the flux is characterized by a high viscosity at temperatures up to and including the maximum storage temperature, $T_{S1}$. More specifically, the flux represented by the temperature profile 10 is solid when the flux is at any temperature up to the maximum storage temperature $T_{S1}$. By way of example, the viscosity of the flux may exceed $10^{12}$ Pa·s when the flux is solid. Furthermore, in one embodiment, when the temperature of the flux is at or below the maximum storage temperate $T_{S1}$, the flux is hard or firm, though the flux composition may be formulated such that the flux has a maximum amount of tackiness as the specific application requires.

With continued reference to the flux represented by temperature profile 10, the flux may be formulated to set the maximum storage temperature $T_{S1}$ at or slightly above the range of temperatures that the flux may experience during shipping and warehousing (shown by arrow 18). As is known, many products experience a wide range of temperatures during shipping and warehousing because these temperatures are often uncontrolled, and depending on geography and other factors, may be in excess of temperatures experienced by the flux in all other environments. In one embodiment, for example, in the flux represented by the temperature profile 10, the flux is in the non-flowable inactive state in the shipping and warehousing environments because the maximum storage temperature $T_{S1}$ is at or slightly higher than the extreme temperatures that may be found in these environments. Consequently, where the maximum storage temperature of the flux exceeds the maximum temperature reached during transportation and warehousing, the flux may be shipped to geographical locations, for example, locations near the equator or when seasonal temperatures are relatively high, without concern that the flux will degrade or deteriorate prior to use. By way of example, temperatures observed during shipment and warehousing may exceed about 45° C. and in some cases may reach 50° C. or even 60° C.

Above the maximum storage temperature $T_{S1}$, the viscosity decreases with increasing temperature and the flux represented by temperature profile 10 enters into a flowable inactive state in which deposition of the solder material is possible, and advantageously, practical. In the case of temperature profile 10, the deposition temperature range $\Delta T_1$ is shown to be entirely within the pasty range of the material, although other embodiments will contemplate deposition in a liquid range of the material as well. The practical temperature range for deposition will depend on the method of deposition, the type of dispensing apparatus, the composition of the solder material, and other factors as may be appreciated by person of ordinary skill in the art. By way of example, $\Delta T_1$ may be about 70° C. to about 90° C., or about 75° C. to about 105° C., or about 90° C. to about 120° C.

Above the deposition temperature range $\Delta T_1$, and in the liquid viscosity range of the material, the flux reaches a liquid active state at the activation temperature $T_{A1}$. At $T_{A1}$ and above, the flux is chemically active and the function of surface preparation and wetting is initiated. By way of example, the $T_{A1}$ may be above about 100° C., or above about 120° C. By way of further example, $T_{A1}$ may be above about 120° C. and below the melting temperature of the solder alloy. As may be appreciated, for a flux with temperature profile 10, the selection of the flux components and the solder alloy would be aimed at providing relatively high activation and melting temperatures to accommodate the high maximum storage temperature needed for the anticipated shipping and warehousing conditions.

While the term "non-flowable" may refer to a solid flux, as described above, the invention is not so limited. The flux may have a paste-like consistency (i.e., lie in a pasty range of viscosities as is labeled in FIG. 1) and may still be considered to be non-flowable. For example, each of the fluxes represented by temperature profiles 12 and 14 are non-flowable at and below the respective maximum storage temperature $T_{S2}$ and $T_{S3}$ because the viscosities of the fluxes are sufficiently high to prevent the fluxes from being dispensed when subject to normal forces encountered in solder paste dispensing or due to gravity. Further, similar to the flux represented by temperature profile 10, the fluxes represented by temperature profiles 12 and 14 may be non-tacky or non-sticky up to and including the respective maximum storage temperature $T_{S2}$, $T_{S3}$ even though the viscosity of the respective flux lies in the pasty range.

With continued reference to FIG. 1, and with specific reference to temperature profile 12, the maximum storage temperature may be set to $T_{S2}$, which is less than $T_{S1}$. However, the maximum storage temperature $T_{S2}$ is greater than the temperatures experienced by the flux in, for example, a manufacturing environment where the temperature is uncontrolled (as shown by arrow 20). As is known in the art, the temperature in manufacturing environments may vary widely depending on numerous factors including geographical location, the time of year, and the type of operations being performed. By way of example, the temperature of a manufacturing environment may range from below room temperature to temperatures in excess of about 40° C. However, uncontrolled manufacturing environment temperatures may be lower than those encountered during shipping and warehousing, described above. Accordingly, in one embodiment, for example, the flux represented by temperature profile 12, the flux is in the non-flowable inactive state in the manufacturing environment because the maximum storage temperature $T_{S2}$ is at or slightly greater than the maximum temperature that is experienced by the flux in that environment.

Additionally, as provided by FIG. 1, the flux represented by the temperature profile 10 would also be in the non-flowable inactive state in a manufacturing environment, because $T_{S1}$ is also above the temperatures found in the manufacturing environment. The flux represented by the temperature profile 10 may be stored in the manufacturing environment, for example, in the vicinity of soldering equipment without concern that the flux will degrade or deteriorate prematurely, but may not perform as well as the flux represented by the temperature profile 12 because of the differences in the formulation between the two different fluxes. The flux represented by the temperature profile 12 may be specifically formulated for that particular manufacturing environment. As may be appreciated, the flux components and solder alloy for a solder material having a flux with temperature profile 12 could be selected to provide lower deposition and activation temperatures than required for the temperature profile 10 because the necessary maximum storage temperature is lower. Thus, by adjusting the formulation of the flux for a specific maximum storage temperature, deposition temperature range, and activation temperature, the shelf life may be extended indefinitely or at least prolonged while the viscosity and other properties of the flux may be formulated for a particular depositing technique and/or optimized for a particular application.

With further reference to temperature profile 12, above the maximum storage temperature $T_{S2}$, the deposition temperature range $\Delta T_2$ is shown to extend between the lower viscosity portion of the pasty range and the higher viscosity portion of the liquid range. Between $\Delta T_2$ and $T_{A2}$, it may be the case that the solder particles begin to separate out, such that the viscosity of the flux is too low to maintain the solder in suspension thereby making deposition impractical. In any event, for a maximum storage temperature $T_{S2}$ set to accommodate an uncontrolled manufacturing environment, $\Delta T_2$ may, for example, be about 45° C. to about 100° C., and by further example, may be about 50° C. to about 75° C. The activation temperature $T_{A2}$ may, for example, be greater than about 100° C., or greater than about 120° C., and below the melting temperature of the solder alloy.

Similarly, with reference to the flux represented by temperature profile 14, in one embodiment, the flux is formulated such that the maximum storage temperature $T_{S3}$ is slightly greater than room temperature or the temperature of a temperature controlled room (shown by arrow 22). The temperature controlled room may be held at a temperature by commercially available heating and air conditioning equipment. The temperature may be comfortable for an operator and/or to keep electronic devices in the room cool. These room and/or controlled temperatures may include temperatures in the range of from about 16° C. to about 27° C. By way of example, the maximum storage temperature may be about 30° C. Again, by formulating the flux to establish the desired temperature profile, as described above, the shelf life may be prolonged while the viscosity and other properties of the flux may be formulated for a particular depositing technique and/or optimized for a particular application. Accordingly, while the fluxes represented by the temperature profiles 10 and 12 may be stored at temperatures slightly greater than the temperature of the temperature controlled room where each remains in a non-flowable inactive state, the flux according to temperature profile 14 may be formulated specifically for that environment such that it may be deposited and activated at predetermined temperatures that would not allow the fluxes represented by the temperature profiles 10 and 12 to be deposited or activated. By way of example, the deposition temperature range $\Delta T_3$, shown to extend from the end of the pasty range to the high viscosity portion of the liquid range, may be about 35° C. to about 45° C., about 40° C. to about 55° C., or about 45° C. to about 60° C. The activation temperature $T_{A3}$ could be as low as about 50° C., and by way of example may be greater than about 100° C., or greater than about 150° C., and below the melting temperature of the solder alloy.

With reference to the flux represented by temperature profile 16, in one embodiment, the flux is formulated such that the maximum storage temperature $T_{S4}$ is greater than the uncontrolled shipping and warehousing temperatures (shown by arrow 18) as set forth above. Thus, the maximum storage temperature $T_{S4}$ may be similar to or higher than the maximum storage temperature $T_{S1}$. As shown, the flux represented by the temperature profile 16 may be solid up to and including the maximum storage temperature. Further, it will be appreciated that the flux according to temperature profile 16 may be formulated specifically to remain solid in a particular environment up to and including the maximum storage temperature. By way of example, the maximum storage temperature may be up to about 59° C. or up to about 61° C., and by way of further example up to about 64° C.

At temperatures above the maximum storage temperature the flux represented by the profile 16 becomes more fluid or liquid-like than the flux represented by temperature profiles 10 and 12. Further, as shown, the rate at which the flux decreases in viscosity with an incremental increase in temperature may be much higher than any of the fluxes represented by temperature profiles 10, 12, or 14. In one embodiment, the relationship between temperature and viscosity is such that the flux appears to melt at a temperature above the maximum storage temperature. In this embodiment, the relationship between viscosity and temperature in this range is such that a small increase in temperature results in a relatively large drop in the viscosity compared to the fluxes represented by profiles 10, 12, and 14. It will be appreciated, however, that the rate of viscosity decrease with temperature may be less than the rate of viscosity decrease associated with the melting of a solid and may be less than the rate of viscosity decrease associated with the fluxes represented by temperature profiles 10, 12, or 14.

In view of the above-described relationship between the viscosity and temperature, the deposition temperature range $\Delta T_4$ for the flux represented by the profile 16 may be narrower than any of the other exemplary fluxes represented by profiles 10, 12, and 14. Further, as shown, the deposition temperature range $\Delta T_4$ may be within the liquid range of viscosity because the "pasty range" of viscosities may extend over a small range of temperatures such that it is not practical to target temperatures in this range for deposition.

In this regard, it may be necessary to hold the temperature within a relatively narrow temperature range to successfully deposit the flux in the liquid range.

As shown, both the upper and lower temperatures defining the range $\Delta T_4$ may be at temperatures that are less than the respective upper and lower temperatures of the range $\Delta T_1$ but may overlap or lie within the range $\Delta T_2$ and be greater than the respective upper and lower temperatures of range $\Delta T_3$. It will be appreciated, however, that the deposition temperature range $\Delta T_4$ may extend between any two temperatures up to a temperature less than the activation temperature, $T_{A4}$, depending on the flux formulation and the equipment utilized to deposit the flux and thus may overlap any single one or more of the ranges $\Delta T_1$, $\Delta T_2$, or $\Delta T_3$. By way of example, the lower and upper temperatures that define the deposition temperature range $\Delta T_4$, shown to extend within the liquid range, may each be greater than about 59° C. For example, the deposition temperature range, $\Delta T_4$, may extend from greater than 59° C. to about 95° C., from about 60° C. to about 85° C., or from about 60° C. to about 70° C. Viscosity of the flux in these ranges may vary, for example, from about 700 kcP (thousands of centipoise, cP) at about 80° C. to about 575 kcP at about 95° C. It will be appreciated, however, that the viscosity is a function of the composition of the flux, as is set forth in more detail below, so the viscosity may be higher or lower than the exemplary viscosities provided above. With regard to the activation temperature $T_{A4}$, it could be as low as a temperature slightly above the deposition temperature range up to and including 120° C. Alternatively, the activation temperature $\Delta T_4$ may be greater than about 120° C. but below the melting temperature of the solder alloy.

In addition, with reference to the temperature profiles 10, 12, 14, 16 depicted in FIG. 1 and taking into account the inactive and active states described above, the portion of each temperature profile 10, 12, 14, 16 up to a temperature that is slightly less than the activation temperature is reversible. In other words, the flux may be repeatedly heated and cooled between any two temperatures that are below the activation temperature $T_{A1}$, $T_{A2}$, $T_{A3}$, and $T_{A4}$ respectively, (i.e., while the flux is in the inactive state) to change the viscosity of the flux. The reversible nature of the temperature-viscosity/hardness profile up to the activation temperature is advantageous. By way of example, the flux may be heated to a temperature within the deposition temperature range, dispensed or deposited onto a surface of a part, cooled to a non-flowable inactive state, and then re-heated and re-flowed as many times as needed without significant degradation of the flux. Then, at some time following any reheating, the flux may then be heated to the activation temperature and later soldered.

In one embodiment, the flux provides a residue-free soldering process. That is, there is no residue from the flux following soldering. This may be advantageous for plumbing applications and the like, as set forth in more detail below. Alternatively, once soldered, any residue from the soldering process may be removed with a solvent. The solvent may be organic, though water-based cleaners may be used depending on the flux formulation. In this regard and in one embodiment, the residue from the soldering process may be water soluble or cleanable with water alone or a mixture of water and detergent and does not require the use of organic solvents.

In addition to the reversible nature of the temperature profile, the non-flowable nature of the flux up to at least the maximum storage temperature is advantageous. As set forth above, at temperatures at and below the maximum storage temperature, the dispensed flux may not have the pasty and/or softness problems associated with traditional dispensed solder paste. Therefore, the flux is less likely to be unintentionally transferred to other surfaces following dispensing and cooling. For example, the flux may be dispensed on to a work piece. Once the flux is cooled to below the maximum storage temperature, the work piece may be shipped and handled without contaminating the flux and without inadvertent removal of the flux therefrom. The work piece may be a circuit board, wires, copper or other metallic pipe, or another substrate. Using the copper pipe as a specific example, the solder material may be pre-applied to the pipe in an optimum amount and in the optimum location. For instance, a copper pipe manufacturer may preapply the solder material at specific, predetermined locations for optimum joint formation. Because this process may be automated, a predetermined quantity of solder material may be applied to the pipe. As such, any guess work associated with a field applied flux is eliminated and the overall consumption of flux material may be reduced. Once the flux is cooled to below the maximum storage temperature of the flux, the pipe may be stored, shipped, and later sold. During subsequent shipping and handling, the flux remains intact and in position. The purchaser may simply reheat the pre-applied solder material to above the activation temperature and the melting temperature of the solder to form a joint with another pipe or fitting. In addition to the above-described advantages, this type of process may provide more consistent, higher quality joints and may allow someone with less skill to form a quality joint. Furthermore, use of extraneous solvents may be eliminated. For example, embodiments of the flux which are residue free or that produce water soluble residue are advantageous in, for example, plumbing applications because any residue may be removed from the joint area with water. In view of this, use of organic, and often hazardous, solvents to remove any residue is avoided.

In another embodiment, the work piece may be a circuit board. As is known in the art, in many cases the copper connections on a circuit board are plated with gold, silver, or other expensive alloys, in order to reduce oxidation. According to embodiments of the present invention, these expensive alloys would not be needed because the solder material could be applied in place of the alloys. The flux may be hydrophobic and thus form a hydrophobic barrier that protects the surface from oxidation and other corrosion-type reactions. The board with the solder material may then be transported to another location without significant loss of the flux or oxidation of the electrical contacts. This would also eliminate the need for later solder paste printing onto circuit boards. In addition, by using the flux, the board would only be heated for the final joining, which would reduce the number of times that the board is exposed to high temperatures. As is known in the art, the more times that an electrical component, like a circuit board, is heated, the greater the chance that it will fail prematurely during use.

In one embodiment, the flux may be dispensed by forcing the flux through an orifice at a temperature within the deposition temperature range. In general, in addition to stenciling systems that are currently utilized to dispense the flux pastes, it is believed that traditional hot-melt dispensing methods and/or products could also be used to dispense the flux because these systems control the deposition temperature. For example, a cartridge dispensing system could be used. An example of such a system is described in U.S. Pat. No. 5,435,462, the disclosure of which is incorporated by reference herein in its entirety. Accordingly, a cartridge containing the flux or solder material may be inserted into a heated cavity in this system.

Alternatively, the flux or solder material could also be placed in bulk containers, such as 5-gallon pails or 55-gallon drums. The pail or drum may be placed on a heated platen or other warming devices to heat the flux to a temperature within the deposition temperature range such that large quantities of the flux may be deposited from a single source. In another embodiment, a slug melter could be used. In this case, a preformed rod or other preformed shape of the solder material could be inserted into the slug melter and a plunger-like device could be used to heat and force the material onto a work piece. In yet another embodiment, the flux may be printed onto a substrate with a heated printing system that maintains the stencil or screen at a selected temperature within the deposition temperature range. The substrate may also be heated. In yet another embodiment, deposition may include dipping a part into a reservoir of the flux held at the deposition temperature. The part may be the targeted part or the part may be used to transfer a predetermined quantity of the flux to the targeted part. Other similar suitable systems may be used to heat and dispense the flux.

As introduced above, the flux comprises a first constituent and one or more secondary constituents selected from solvents, thickeners, and/or metal oxide reducing agents, for instance, an acid. The proportions of the first constituent and one or more secondary constituents are selected to provide the desired temperature profile, described above. For example, in preparing the flux, the first constituent and secondary constituents may be selected based on the maximum storage temperature needed to store, handle, or transport the flux; the desired deposition temperature range; the desired activation temperature; the function of the flux upon activation; the amount and type of any residue remaining on the surface following joint formation; and whether the residue, if any, must be removed and how it is removed from the surface.

In one embodiment, the first constituent comprises a rosin, a resin, or a wax or a combination or mixture thereof. Alternative or additional compounds in the first constituent may include polyglycols, such as, polyethylene glycol or polypropylene glycol; cocamides; and/or other suitable compounds. Thus, "constituent" should not be interpreted as strictly singular. The first constituent holds the flux and any solder particles together, and may include one or more compounds that collectively make up greater than 50 wt. % of the flux, though embodiments of the invention are not so limited. For example, the flux may contain less than 50 wt. % of the first constituent, though the flux may contain more of the first constituent by weight than the any of secondary constituents alone. The first constituent may be a solid at room temperature and/or may have a softening point greater than about 50° C. Generally, the higher the softening temperature of the first constituent, the higher the maximum storage temperature and the higher the deposition temperature range. By way of additional example, the softening point may be at least about 80° C.

In one embodiment in which the first constituent includes a rosin, the rosin may be, for example, a natural rosin, such as water white rosin. Other rosins, such as hydrogenated wood rosin, tall oil rosin, gum rosin and disproportionate wood rosin or mixtures thereof may be mixed with the secondary constituents to provide the desired temperature profile, as described above. Suitable commercially available rosins or modified rosins include Dymerex™ sold by Eastman or Nuroz™ sold by Newport Industries Ltd, Pentalyn® 830 sold by Pinova, Inc., and Sylvaros® PR140 sold by Arizona Chemical Company.

A resin may be obtained by modifying one or more of the rosins described above by combining the rosin with an unsaturated organic acid. Examples of suitable, commercially available resins include Staybelite®, sold by Ashland, and Poly-Pale™ sold by Eastman. Examples of waxes suitable for use include waxes of polypropylene glycol and polyethylene glycol, such as those available from Dow Chemical Company, having, for example, an average molecular weight of about 1450 or greater and, by way of additional example, those having an average molecular weight of about 4000 or greater; microcrystalline waxes; naphthenic waxes; and/or paraffin waxes; among others. Suitable commercially available waxes include CM 7010 W and other CM series waxes sold by Caromax International.

In one embodiment, the one or more secondary constituents may be used to adjust the temperature profile of the flux in order to account for the temperatures that are expected during shipping and warehousing and/or within the manufacturing environment, as set forth above. Additionally, the secondary constituents may, among other criteria, be selected and proportioned to adjust the deposition temperature range and the activation temperature, as well as the specific reaction with the targeted surface. By way of example, the secondary constituent may include a carrier or one or more solvents, such as, mineral spirits or glycerine, and/or a thickener. Further, the secondary constituent may include an acid or mixture of acids. Suitable acids may include weak acids, and more particularly weak organic acids, such as a carboxylic acid, for example, stearic acid, azelaic acid, and/or a saturated fatty acid having, for example, a chain of 16 to 24 carbon atoms.

In one embodiment, the flux includes an activator to clean the surface by removing oxides and other contaminants. The activator may be a weak organic acid, a halogenated compound, an amine, or other metal oxide reducing agent. By way of additional example, the activator may be an amine hydrohalide, for instance, dimethylamine HCl, diethylamine HCl, diethylamine HBr, and/or diisoproplyamine HCl. Furthermore, the activator may be selected based on the type of surface on which the flux is to be dispensed and/or the desired activation temperature of the flux. Other suitable secondary constituents may include an alcohol, such as high molecular weight alcohols (e.g., having 14 to 18 carbon atoms). The flux optionally includes other secondary constituents, such as plasticizers and/or a surface tension modifying agent or surfactant, for example, a non-ionic surfactant, which reduces or eliminates solder ball production when the flux is mixed with solder particles and is used to form a solder joint.

In one embodiment, the flux may include a 2:1 ratio of hydrogenated rosin with a softening point of approximately 70° C. to 1-Octadecanol. This mixture may further include a weak organic acid in a quantity appropriate to reduce oxides during reflow. The flux may also include a thixotrope to adjust the deposition temperature range to include a temperature of 40° C. Solder particles may be dispersed within the flux and mineral spirits may be added to adjust the deposition temperature range.

In one embodiment, the flux may include from about 50 wt. % to about 90 wt. % of polyethylene glycol wax having an average molecular weight of 4000 or greater; from about 2 wt. % to about 10 wt. % of microcrystalline wax; from about 2 wt. % to about 20 wt. % of an amine hydrohalide (e.g., dimethylamine HCI); and, optionally, up to about 2 wt. % of a non-ionic surfactant, with the balance being water (e.g., deionized water).

In the above embodiment, the flux may be represented by a temperature profile in which the flux is solid up to a maximum storage temperature, for example, of about 59° C., about 60° C., or about 63° C. The viscosity of the flux may drop rapidly with increasing temperature. As such, the deposition temperature range may be within a liquid range of the flux and be greater than about 59° C., for example, from greater than about 59° C. to about 66° C., from about 60° C. to about 65° C., or from about 60° C. to about 64° C. The viscosity of the flux in the deposition temperature range may range from about 170 kcP to about 800 kcP and preferably from about 400 kcP to about 500 kcP. The activation temperature may depend on the type and amount of the amine hydrohalide in the flux. For example, increasing the amount of the amine hydrohalide may reduce the activation temperature to below 120° C.

In one embodiment, the flux may include from about 25 wt. % to about 40 wt. % of polypropylene glycol; from about 25 wt. % to about 40 wt. % glycerine; from about 10 wt. % to about 40 wt. % of high-molecular weight alcohol (e.g., having 14 to 18 carbon atoms); and from about 1 wt. % to about 10 wt. % of an amine hydrohalide (e.g., dimethylamine HCI). In one embodiment, the flux is in a non-flowable inactive state up to about 80° C.

In one embodiment, the flux may include from about 60 wt. % to about 90 wt. % of a modified rosin having a softening point of greater than 140° C. and an acid value greater than about 140; from about 10 wt. % to about 20 wt. % of polyethylene glycol wax having an average molecular weight of 1450 or greater; from about 1 wt. % to about 3 wt. % of dicarboxylic acid having 3 or more carbon atoms; 1 wt. % to about 3 wt. % of saturated fatty acid having 16 to 24 carbon atoms; and 4 wt. % to about 6 wt. % of phthalate plasticizer having 7 to 11 carbon atoms. In one embodiment, the flux is in a non-flowable inactive state up to at least about 60° C.

In one embodiment, the solder particles that are mixed with the flux may comprise tin (Sn), lead (Pb), silver (Ag), bismuth (Bi), copper (Cu), antimony (Sb), Indium (In), Zinc (Zn), or Nickel (Ni), or alloys or combinations thereof as is appropriate for the application. Alloys of various combinations of the above-mentioned elements may each have a specific application. However, widely used solder alloys include, for example, Sn—Pb alloys like 60Sn-40Pb and 63Sn-37Pb. However, "lead-free" soldering alloys, for instance, Sn—Cu, Sn—Ag, and Sn—Sb alloy-based solders, are known in the art. In order to facilitate a more complete understanding of the invention, the following non-limiting examples are provided.

EXAMPLE 1

A flux that is solid at room temperature was prepared. The flux contained 80 wt. % partially hydrogenated rosin having a softening temperature of approximately 80° C. and an acid value of 150-170, 15 wt. % polyethylene glycol 1450, 2.5 wt. % azelaic acid, and 2.5 wt. % stearic acid.

A solder material was prepared by dispersing solder particles in the above flux. The solder material contained 85 wt. % solder particles of 96.5Sn-3Ag-0.5Cu alloy with the above flux forming the balance of the solder material. At 22° C., the solder material was solid. The deposition temperature range was roughly 45° C. to 60° C. The activation temperature was approximately 95° C.

EXAMPLES 2-17

The flux compositions set forth in Table 1, below, were prepared by melting a polyethylene glycol (PEG) wax from Dow Chemical Company at the indicated "Vessel Temp" (in Table 2, below). An activator, dimethylamine HCI, which was previously dissolved in water, was mixed into the melted PEG while the temperature was held at the Vessel Temp. Mixing of the dissolved dimethylamine HCI was concluded when it was observed that the water was driven off. Next, the microcrystalline wax was mixed into the melted mixture until the wax dissolved. The surfactant, if any, was then added. The flux may be formed by cooling the mixture. In each example, an alloy powder of 99 Sn and 1 Cu was mixed with the flux such that the solder material was 85 alloy powder.

TABLE 1

| Example No. | PEG wax[1] | surfactant[2] | Dimethylamine HCl | Water[3] | Microcrystalline wax[4] |
|---|---|---|---|---|---|
| 2 | 80.00 | 0.00 | 12.00 | 6.00 | 2.00 |
| 3 | 65.00 | 1.00 | 16.00 | 12.00 | 6.00 |
| 4 | 62.00 | 0.00 | 16.00 | 12.00 | 10.00 |
| 5 | 74.00 | 2.00 | 12.00 | 6.00 | 6.00 |
| 6 | 63.00 | 1.00 | 12.00 | 18.00 | 6.00 |
| 7 | 66.00 | 2.00 | 16.00 | 6.00 | 10.00 |
| 8 | 66.00 | 0.00 | 20.00 | 12.00 | 2.00 |
| 9 | 60.00 | 2.00 | 20.00 | 12.00 | 6.00 |
| 10 | 60.00 | 0.00 | 12.00 | 18.00 | 10.00 |
| 11 | 75.00 | 1.00 | 16.00 | 6.00 | 2.00 |
| 12 | 63.00 | 1.00 | 20.00 | 6.00 | 10.00 |
| 13 | 72.00 | 2.00 | 12.00 | 12.00 | 2.00 |
| 14 | 60.00 | 0.00 | 16.00 | 18.00 | 6.00 |
| 15 | 62.00 | 2.00 | 16.00 | 18.00 | 2.00 |
| 16 | 68.00 | 0.00 | 20.00 | 6.00 | 6.00 |
| 17 | 65.00 | 1.00 | 12.00 | 12.00 | 10.00 |

TABLE 2

| Example No. | Vessel Temp (° C.) | Melting temperature (° C.)[5] | Viscosity (kcP)[6] |
|---|---|---|---|
| 2 | 91 | 63.63 | 169.33 |
| 3 | 98 | 63.93 | 638.33 |
| 4 | 105 | 65.00 | 737.00 |
| 5 | 98 | 64.30 | 230.00 |
| 6 | 105 | 63.60 | 501.67 |
| 7 | 91 | 63.90 | 499.67 |
| 8 | 98 | 63.37 | 507.33 |
| 9 | 91 | 64.00 | 624.67 |
| 10 | 98 | 64.50 | 512.00 |
| 11 | 105 | 62.60 | 212.00 |
| 12 | 98 | 64.83 | 562.00 |
| 13 | 105 | 62.97 | 217.67 |
| 14 | 91 | 65.23 | 669.00 |
| 15 | 98 | 59.77 | 532.67 |
| 16 | 105 | 59.63 | 606.00 |
| 17 | 91 | 60.03 | 420.33 |

Notes:
[1] available from Dow Chemical Company
[2] Triton X100
[3] deionized water
[4] Reed wax 5910A
[5] Determined by DSC
[6] Measured at 90° C. with a Brookfield viscometer model RVT with an e-spindle The melting temperature (in Table 2) or transition temperature was determined by differential scanning calorimetry (DSC). FIG. 2 illustrates an exemplary DSC curve of the flux material. The melting temperature listed in Table 2 is an average of three measurements of the first endothermic peak (i.e., at arrow 24) for each composition. The second endothermic peak (i.e., at arrow 26) is thought to be the result of evolution of water, and the third endothermic peak (i.e., at arrow 28) indicates the reflow or melting of the alloy powder.

The maximum storage temperature for each example 2-17 is a temperature slightly below the corresponding melting temperature for that flux material. Below the indicated melting temperature, the composition is substantially solid or in a non-flowable inactive state. The activation temperature for each of examples 2-17 is believed to be about 120° C. with reflow at about 230° C. (the reflow temperature is determined by DSC measurement, as shown in FIG. 2.

In another embodiment, a method of making the flux includes heating the first constituent to a liquid state, if not already in such a state. While the first constituent is in the liquid state, the one or more secondary constituents are added to form a flux mixture. The flux mixture is cooled to a temperature at or below the maximum storage temperature where the flux mixture is in the non-flowable inactive state.

In one embodiment of the invention, the solder material may be made by heating the flux to a temperature within or above the deposition temperature range and below the activation temperature. While the flux is in the flowable inactive state, the solder particles are dispersed throughout the heated flux to form a solder/flux mixture. The solder/flux mixture is allowed to cool to a temperature at or below the maximum storage temperature whereby the solder/flux mixture is in the non-flowable inactive state.

While the present invention has been illustrated by a description of various embodiments and while these embodiments have been described in some detail, it is not the intention of the Applicant to restrict or in any way limit the scope of the appended claims to such detail. Additional advantages and modifications will readily appear to those of ordinary skill in the art. The various features of the invention may be used alone or in numerous combinations depending on the needs and preferences of the user.

What is claimed is:

1. A solder material comprising:
   a solder/flux mixture of solder particles dispersed in a flux,
   wherein the solder/flux mixture is a solid at room temperature;
   the flux comprises a first constituent including a polyglycol and one or more secondary constituents selected from solvents, thickeners, and metal oxide reducing agents;
   the flux has a temperature profile in which the flux is in a non-flowable inactive state at temperatures at and below a maximum storage temperature, a liquid active state at an activation temperature, and a flowable inactive state in a deposition temperature range above the maximum storage temperature and below the activation temperature, the maximum storage temperature being above about 27° C., and
   the solder particles are in a liquid state at or above the activation temperature.

2. The solder material of claim 1 wherein the maximum storage temperature is about 40° C.

3. The solder material of claim 2 wherein the deposition temperature range includes temperatures in the range of about 45° C. to about 100° C.

4. The solder material of claim 3 wherein the activation temperature is about 120° C. or greater.

5. The solder material of claim 1 wherein the non-flowable inactive state is a solid state.

6. The solder material of claim 1 wherein the deposition temperature range includes temperatures in the range of about 75° C. to about 105° C. and the activation temperature is above the deposition temperature range.

7. The solder material of claim 1 wherein the deposition temperature range includes temperatures in the range of about 45° C. to about 60° C. and the activation temperature is above the deposition temperature range.

8. The solder material of claim 1 wherein the first constituent comprises a rosin, a resin, a wax, or a polyglycol or a combination thereof.

9. The solder material of claim 1 wherein the first constituent comprises polyethylene glycol or polypropylene glycol.

10. The solder material of claim 1 wherein the flux includes a rosin.

11. The solder material of claim 10 wherein the one or more secondary constituents includes a plasticizer.

12. The solder material of claim 11 wherein the plasticizer is a phthalate plasticizer.

13. The solder material of claim 1 wherein the solder particles are made of a lead-free soldering alloy.

14. The solder material of claim 13 wherein the lead-free soldering alloy is an alloy selected from the group consisting of a tin-copper alloy, a tin-silver alloy, a tin-antimony alloy, a tin-silver-copper alloy, and mixtures thereof.

15. The solder material of claim 13 wherein the lead-free soldering alloy is a tin-silver-copper alloy.

16. The solder material of claim 1 wherein the solder particles are made of an alloy including at least one element selected from tin, copper, silver, and antimony.

17. An apparatus comprising:
   a substrate; and
   a layer consisting of the solder material of claim 1 attached to the substrate.

18. The apparatus of claim 17 wherein the substrate is one of a copper pipe or metallic fitting, an electrical component, or a wire.

19. A method of making the solder material of claim 1, comprising:
   heating the flux to a temperature within or above the deposition temperature range and below the activation temperature;
   dispersing solder particles throughout the heated flux to form the solder/flux mixture; and
   cooling the solder/flux mixture to room temperature whereby the solder/flux mixture is a solid.

20. A method of dispensing the solder material of claim 1 comprising:
   heating the solder material to a temperature within or above the deposition temperature range and below the activation temperature;
   while the solder material is within or above the deposition temperature range and below the activation temperature, dispensing the heated solder material onto a substrate; and
   cooling the solder material to a temperature at or below the maximum storage temperature whereby the solder material is in the non-flowable inactive state.

21. The method of claim 20 wherein dispensing includes forcing the heated solder material through an orifice.

22. The method of claim 20 wherein prior to heating the solder material, the method further comprises:

storing the solder material at or below the maximum storage temperature whereby the solder material is in the non-flowable inactive state.

23. A method of soldering with the solder material of claim 1 comprising:
    heating the solder material to a temperature within or above the deposition temperature range and below the activation temperature;
    while the solder material is within or above the deposition temperature range and below the activation temperature, dispensing the heated solder material onto a work piece;
    heating the solder material to or above the activation temperature whereby the flux removes oxides from the surface of the work piece;
    heating the solder material to a melting temperature of the solder particles to melt the solder particles while in contact with the surface of the work piece; and
    cooling the melted solder.

24. The method of claim 23 wherein dispensing includes forcing the heated solder material through an orifice.

25. A method of soldering with the solder material of claim 1 comprising:
    heating the solder material from a temperature at or below the maximum storage temperature to a melting temperature of the solder particles to melt the solder particles, the solder material being positioned between and in contact with each of a first work piece and a second work piece; and
    cooling the melted solder whereby a joint is formed between the first and the second work pieces.

26. The method of claim 25 wherein the first work piece is one of a copper pipe or metallic fitting, an electrical component, or a wire.

27. A method of making the solder material of claim 1, comprising:
    heating the first constituent to a liquid state;
    adding the one or more secondary constituents to the first constituent while in the liquid state to form a flux mixture that is in the flowable inactive state;
    dispersing solder particles throughout the heated flux mixture to form the solder/flux mixture; and
    cooling the solder/flux mixture to room temperature whereby the solder/flux mixture is a solid.

* * * * *